US009653458B1

(12) United States Patent
Cheng et al.

(10) Patent No.: US 9,653,458 B1
(45) Date of Patent: May 16, 2017

(54) INTEGRATED DEVICE WITH P-I-N DIODES AND VERTICAL FIELD EFFECT TRANSISTORS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/272,570

(22) Filed: Sep. 22, 2016

(51) Int. Cl.
  *H01L 27/06* (2006.01)
  *H01L 27/07* (2006.01)
  *H01L 29/78* (2006.01)
  *H01L 29/868* (2006.01)
  *H01L 27/02* (2006.01)
  *H01L 29/66* (2006.01)
  *H01L 29/06* (2006.01)

(52) U.S. Cl.
  CPC ...... *H01L 27/0727* (2013.01); *H01L 27/0255* (2013.01); *H01L 29/0649* (2013.01); *H01L 29/66136* (2013.01); *H01L 29/66666* (2013.01); *H01L 29/7827* (2013.01); *H01L 29/868* (2013.01)

(58) Field of Classification Search
  CPC ............ H01L 27/0255; H01L 27/0727; H01L 29/0649; H01L 29/66136; H01L 29/66666; H01L 29/7827; H01L 29/868
  See application file for complete search history.

(56) References Cited

U.S. PATENT DOCUMENTS

| | | | |
|---|---|---|---|
| 7,221,032 B2 | 5/2007 | Kondo | |
| 7,560,784 B2 | 7/2009 | Cheng et al. | |
| 7,608,867 B2 | 10/2009 | Charbuillet et al. | |
| 7,964,893 B2 | 6/2011 | Lee | |
| 8,362,572 B2 | 1/2013 | Huang et al. | |
| 8,502,234 B2 | 8/2013 | Kizilyalli et al. | |
| 8,928,074 B2 | 1/2015 | Cheng et al. | |
| 2009/0001434 A1 | 1/2009 | Bach et al. | |
| 2015/0262663 A1 | 9/2015 | Lee et al. | |
| 2016/0035867 A1* | 2/2016 | Pfirsch | H01L 27/0664 257/140 |
| 2016/0197225 A1 | 7/2016 | Payne | |

* cited by examiner

*Primary Examiner* — Daniel Shook
(74) *Attorney, Agent, or Firm* — Cantor Colburn LLP; Vazken Alexanian

(57) ABSTRACT

An integrated device includes a substrate, first and second vertical transistors and first and second common epitaxy. The substrate includes an upper surface with first substrate regions doped with a first dopant and second substrate regions doped with a second dopant. The first vertical transistor is operably disposed on the upper surface at a first one of the first substrate regions. The second vertical transistor is operably disposed on the upper surface at a first one of the second substrate regions. The first diode is operably disposed on the upper surface at a second one of the first substrate regions. The second diode is operably disposed on the upper surface at a second one of the second substrate regions. The first common epitaxy is provided for the first vertical transistor and the second diode and the second common epitaxy is provided for the second vertical transistor and the first diode.

20 Claims, 11 Drawing Sheets

US 9,653,458 B1

INTEGRATED DEVICE WITH P-I-N DIODES AND VERTICAL FIELD EFFECT TRANSISTORS

BACKGROUND

The present invention relates to semiconductor devices and, more specifically, to an integrated device with P-I-N diodes and vertical field effect transistors.

In semiconductor device manufacturing, vertical transistors or vertical field effect transistors (VFETs) provide advantages over other types of transistors. Such advantages include, but are not limited to, the decoupling of gate length from contact gate pitch. As a result, recent efforts have been undertaken to explore the feasibility of using VFET devices to provide continued complementary metal-oxide-semiconductor (CMOS) scaling.

SUMMARY

According to a non-limiting embodiment of the present invention, an integrated device is provided and includes a substrate, first and second vertical transistors and first and second common epitaxy. The substrate includes an upper surface with first substrate regions doped with a first dopant and second substrate regions doped with a second dopant. The first vertical transistor is operably disposed on the upper surface at a first one of the first substrate regions. The second vertical transistor is operably disposed on the upper surface at a first one of the second substrate regions. The first diode is operably disposed on the upper surface at a second one of the first substrate regions. The second diode is operably disposed on the upper surface at a second one of the second substrate regions. The first common epitaxy is provided for the first vertical transistor and the second diode and the second common epitaxy is provided for the second vertical transistor and the first diode.

According to another non-limiting embodiment, a method of forming an integrated device is provided. The method includes defining, in an upper surface of a substrate, first substrate regions doped with a first dopant and second substrate regions doped with a second dopant. The method further includes operably disposing a first vertical transistor on the upper surface at a first one of the first substrate regions, a second vertical transistor on the upper surface at a first one of the second substrate regions, a first diode on the upper surface at a second one of the first substrate regions and a second diode on the upper surface at a second one of the second substrate regions. In addition, the method includes growing first common epitaxy for the first vertical transistor and the second diode and second common epitaxy for the second vertical transistor and the first diode.

According to yet another non-limiting embodiment, a method of forming an integrated device is provided. The method includes forming fin and pillar structures in insulated vertical transistor and diode regions, respectively, of a doped upper surface of a semiconductor substrate. The method further includes sequentially modifying the fin structures into n-type and p-type vertical field effect transistors (VFETs) and the pillar structures into PiN and NiP diodes. In addition, the method includes growing first common epitaxial contacts for the n-type VFETs and the NiP diodes and second common epitaxial contacts for the p-type VFETs and the PiN diodes.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-11 are a series of views illustrating an integrated device with n-type and p-type vertical transistors as well as PiN and NiP diodes according to exemplary embodiments of the present teachings, in which:

FIG. 1 is a side view of a semiconductor substrate with n-type and p-type doping in accordance with one or more embodiments;

FIG. 2 is a side view of fin and pillar structures that are grown and patterned on a semiconductor substrate in accordance with one or more embodiments;

FIG. 3 is a side view of bottom spacers, high-k dielectric material and an n-type metal provided on and around fin and pillar structures of a semiconductor substrate in accordance with one or more embodiments;

FIG. 4 is a side view of a mask regions left behind by removal of an n-type metal in accordance with one or more embodiments;

FIG. 5 is a side view of p-type metal provided in the regions of FIG. 4 in accordance with one or more embodiments;

FIG. 6 is a side view of patterned gates and deposited interlayer dielectric (ILD) material in accordance with one or more embodiments;

FIG. 7 is a side view of top spacers and deposited ILD material at the patterned gates of FIG. 6 in accordance with one or more embodiments;

FIG. 8 is a side view of a masked p-type vertical field effect transistor (VFET) and a masked NiP diode and regions left behind by hard mask material being removed from an n-type VFET and a PiN diode in accordance with one or more embodiments;

FIG. 9 is a side view of epitaxial contacts grown in the regions left behind by the hard mask material removal of FIG. 8 in accordance with one or more embodiments;

FIG. 10 is a side view of the epitaxial contacts of FIG. 9 being masked and epitaxial contacts grown over a p-type VFET and an NiP diode in accordance with embodiments; and FIG. 11 is a side view of an integrated device with common epitaxially grown contacts for an n-type VFET and a PiN contact and for a p-type VFET and an NiP diode in accordance with one or more embodiments.

DETAILED DESCRIPTION

Figure 1:
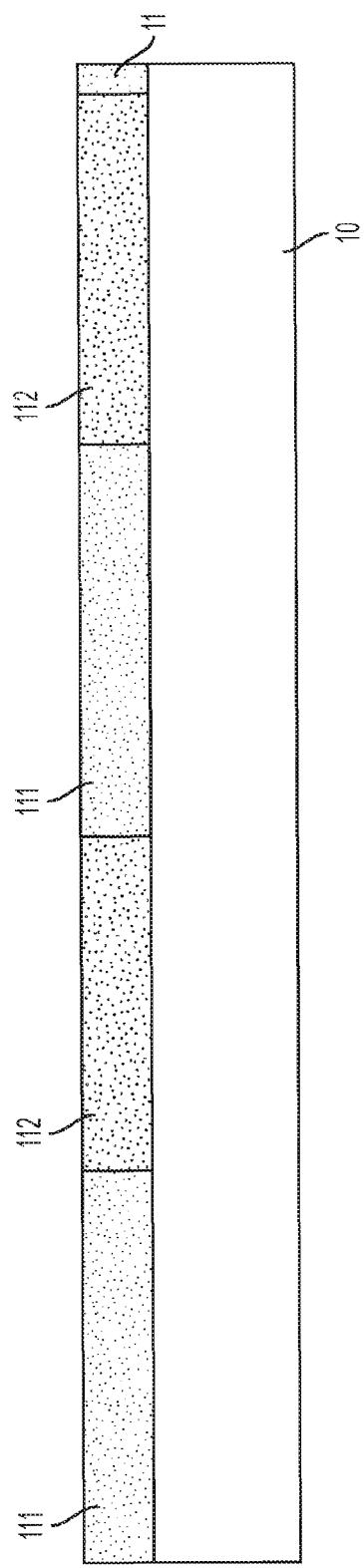

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of background technologies that are more specifically relevant to aspects of the present invention, junction diodes such as PiN or NiP diodes, for example, are commonly used in a wide variety of products such as Radio Frequency (RF) switching devices, telecommunication devices, Electrostatic Discharge (ESD) protect devices, image sensors, and the like. PiN and NiP diodes are diodes with wide, un-doped intrinsic semiconductor regions between p-type and n-type semiconductor regions. PiN and NiP diodes thus have three layers including a p-doped semiconductor layer (P), an intrinsic layer (I) and an n-doped semiconductor layer (N).

PiN and NiP diodes can be used as photodetectors or optical receivers. For example, when exposed to light, a current is generated in the PiN photodiodes and the magnitude of the current depends on the intensity of the light. When no light is present, the photodiode can be reversed biased and almost no current is generated. PiN and NiP junctions can also be used in various types of semiconductor devices that often require transistor elements for other applications. Therefore, it becomes necessary to incorporate VFETs and PiN and NiP diodes on the same semiconductor device substrate.

Turning now to an overview of the present invention, one or more embodiments relate to an integrated device that includes a substrate, first and second vertical transistors and first and second common epitaxially grown contacts. The substrate includes an upper surface with first substrate regions doped with a first dopant and second substrate regions doped with a second dopant. The first vertical transistor is operably disposed on the upper surface at a first one of the first substrate regions, the second vertical transistor is operably disposed on the upper surface at a first one of the second substrate regions, the first diode operably is disposed on the upper surface at a second one of the first substrate regions and the second diode is operably disposed on the upper surface at a second one of the second substrate regions. The first and second common epitaxially grown contacts are provided for the first vertical transistor and the second diode and for the second vertical transistor and the first diode, respectively.

Turning now to a more detailed description of embodiments of the present invention, FIG. 1 depicts a semiconductor substrate 10, which can be, for example, a bulk substrate including semiconductor material including, but not limited to, silicon (Si), silicon germanium (SiGe), silicon carbide (SiC), silicon-germanium-carbon (SiGeC) or other like semiconductor material. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. In addition, multiple layers of the semiconductor materials can be used as the semiconductor material of the semiconductor substrate 10.

The semiconductor substrate 10 can also have multiple material layers, for example, a semiconductor-on-insulator substrate (SeOI), a silicon-on-insulator substrate (SOI), a germanium-on-insulator substrate (GeOI) or a silicon-germanium-on-insulator substrate (SGOI). The semiconductor substrate 10 can also have other layers forming the substrate 10, including high-k oxides and/or nitrides, as well as other structures, such as trench isolation features (not shown until FIG. 2). In one or more embodiments, the semiconductor substrate 10 can be a silicon wafer or, more particularly, a single crystal or a monocrystalline silicon wafer.

The semiconductor substrate 10 is substantially planarized and has an upper surface 11. At an initial stage, the upper surface 11 is doped by ion implantation, plasma doping, plasma immersion, in-situ doped epitaxial growth with masking, etc. As shown in FIG. 1, this doping can result in the formation of first substrate regions 111, which can be doped with a first dopant, such as an n-type dopant (e.g., phosphorus, arsenic, antimony), and in the formation of second substrate regions 112, which can be doped with a second dopant, such as a p-type dopant (e.g., boron, gallium, indium). At least a first one of the first substrate regions 111 can be used as a basis for the formation of an n-type vertical transistor or, more particularly, an n-type vertical field effect transistor (n-VFET). Similarly, at least a first one of the second substrate regions 112 can be used as a basis for the formation of a p-type vertical transistor or, more particularly, a p-VFET. In addition, at least a second one of the first substrate regions 111 can be used as a basis for the formation of a first diode, such as an NiP diode, and at least a second one of the second substrate regions 112 can be used as a basis for the formation of a second diode, such as a PiN diode.

In accordance with one or more embodiments, doping concentrations can range from $1E19/cm^2$ to $2E21/cm^2$, although greater or lesser doping concentrations can also be employed. These ranges will also apply to other doping or doped features described herein.

While FIG. 1 illustrates that the first substrate regions 111 and the second substrate regions 112 are interleaved with one another, it is to be understood that this is not required and that other configurations are possible. The following description relates to this exemplary case, however, for reasons of clarity and brevity.

Figure 2:
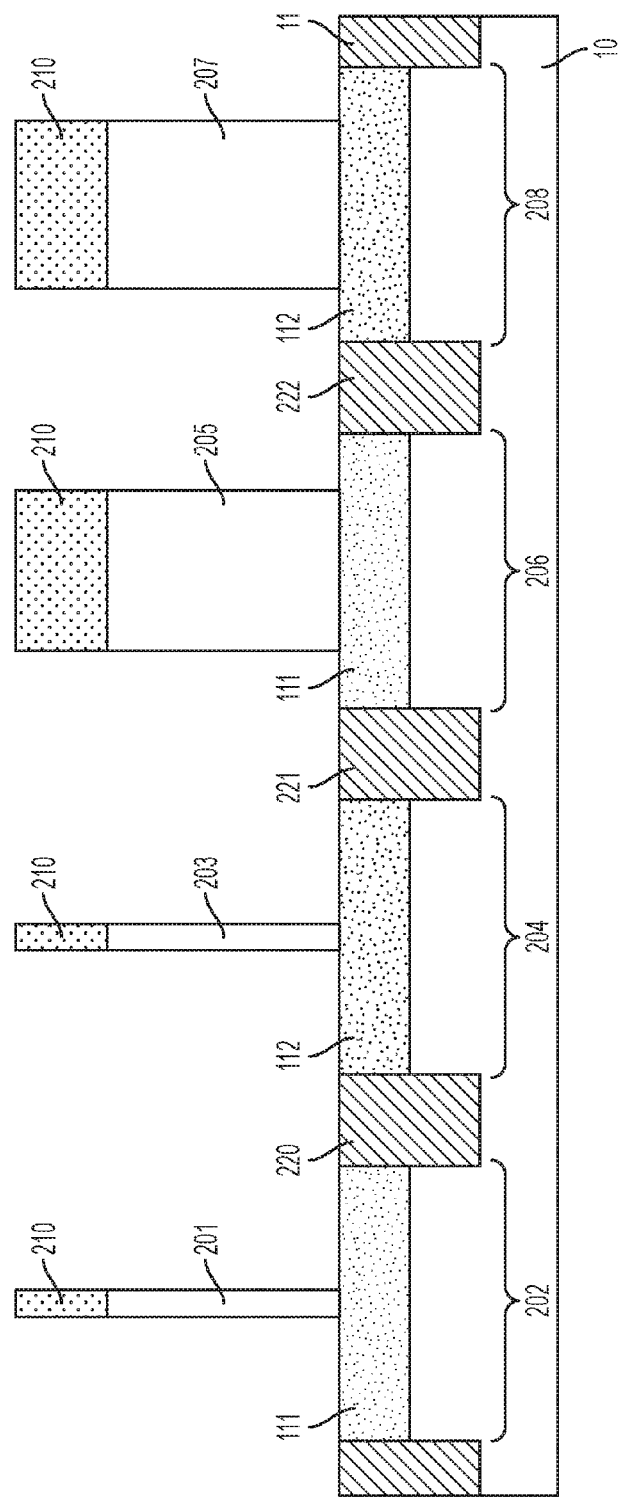

With reference to FIG. 2, a first un-doped channel 201 is epitaxially grown on the upper surface 11 to have a fin shape at a first one of the first substrate regions 111 (i.e., in n-VFET region 202), a second un-doped channel 203 is epitaxially grown on the upper surface 11 to have a fin shape at a first one of the second substrate regions 112 (i.e., in p-VFET region 204), a third un-doped channel 205 is epitaxially grown on the upper surface 11 to have a fin or pillar shape at a second one of the second substrate regions 112 (i.e., in NiP diode region 206) and a fourth un-doped channel 207 is epitaxially grown on the upper surface 11 to have a fin or pillar shape at a second one of the second substrate regions 112 (i.e., in PiN diode region 208). As shown in FIG. 2, the first un-doped channel 201, the second un-doped channel 203, the third un-doped channel 205 and the fourth un-doped channel 207 can each have a hard mask 210 disposed thereof by deposition or another suitable process. The hard mask 210 can be formed of nitride, such as silicon nitride (SiN), an oxide. In addition, the third un-doped channel 205 and the fourth un-doped channel 207 can be wider than the first un-doped channel 201 and the second un-doped channel 203. As such, the hard mask for the third and fourth un-doped channels 205 and 207 can be correspondingly wide than the hard masks 210 of the first and second un-doped channels 201 and 203.

As further shown in FIG. 2, a plurality of shallow trench isolation (STI) features 220, 221 and 222 are provided to separate neighboring regions from one another. That is, STI feature 220 is disposed to separate n-VFET region 202 from p-VFET region 204, STI feature 221 is disposed to separate p-VFET region 204 from NiP diode region 206 and STI feature 222 is disposed to separate NiP diode region 206 from PiN diode region 208. Additional STI features can be provided outside of the n-VFET region 202 and the PiN diode region 208. Each STI feature 220, 221 and 222 has an upper surface that is substantially coplanar with the upper surface of the 11 of the semiconductor substrate 10.

In one or more embodiments, an un-doped layer (e.g., un-doped silicon) is epitaxially grown on doped layers of the first and second substrate regions 111 and 112. Here, a hard mask layer, formed of materials such as silicon nitride (SiN), is then deposited. Subsequently, patterning techniques such as lithography and/or sidewall image transfer (SIT) followed by etchings can be used to form the first, second, third and fourth un-doped channels 201, 203, 205 and 207. The STI features 220, 221 and 222 can be formed before or after the formation of the first, second, third and fourth un-doped channels 201, 203, 205 and 207.

In any case, it may be seen from FIG. 2 that the STI feature 221 divides the semiconductor substrate 10 into a vertical transistor section on one side thereof and a diode section on another side thereof in accordance with one or more embodiments. This is not required, however, and it is to be understood that other configurations are possible. For example, n-type or p-type vertical transistors and NiP or PiN diodes may be interleaved with one another.

Figure 3:
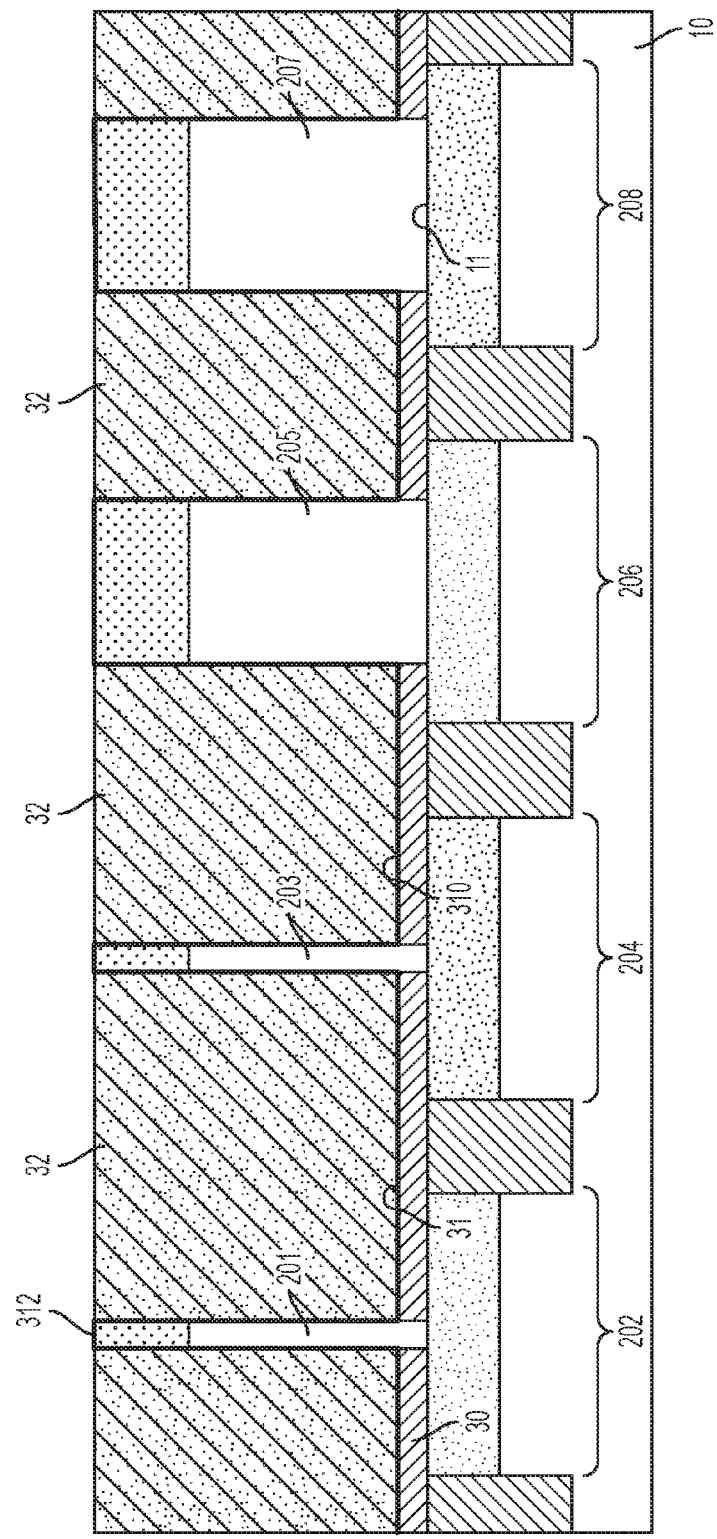

With reference to FIG. 3, bottom spacers 30 are formed by any suitable process on the upper surface 11 of the semiconductor substrate 10 between and around lower portions of the first, second, third and fourth un-doped channels 201, 203, 205 and 207. The bottom spacers 30 can include any nitride or oxide dielectric material, including but not limited to, silicon oxide, silicon nitride, silicon oxynitride, SiBCN, SiOCN, SiOC or any suitable combination of those materials. Subsequently, a gate dielectric (e.g., high-k dielectric) layer 31 is deposited over upper surfaces of the bottom spacers 30, sidewalls of the first, second, third and fourth un-doped channels 201, 203, 205 and 207, corresponding sidewalls of the hard masks 210 and upper surfaces of the hard masks 210. Thus, the high-k dielectric layer 31 includes lower portions 310 running along the bottom spacers 30, sidewall portions 311 running along the respective sidewalls of the first, second, third and fourth un-doped channels 201, 203, 205 and 207 and the hard masks 210 and upper portions 312 running along the upper surfaces of the hard masks 210. At this point, one of an n-type or p-type metal gate material 32 is deposited over upper surfaces of the lower portions 310 of the high-k dielectric layer 31 and between complementary sidewall portions 311 of the high-k dielectric layer 31.

While FIG. 3 illustrates that an n-type metal gate material 32 is deposited over the upper surfaces of the lower portions 310 of the high-k dielectric layer 31 and between the complementary sidewall portions 311 of the high-k dielectric layer 31, it is to be understood that this is not required and that p-type metal gate material may be deposited at this point instead. The following description will relate only to the illustrated case of FIG. 3 in which the n-type metal gate material 32 is deposited, however, for purposes of clarity and brevity.

As used herein, metal gate material refers to metals and conducting metallic compounds. The n-type metal gate material 32 can include a single layer or multiple layers of material(s). This applies as well to descriptions of p-type metal gate material 50 provided below.

Thus, as shown in FIG. 3, the n-type metal gate material 32 effectively surrounds the first un-doped channel 201 in n-VFET region 202 and extends to the second un-doped channel 203, surrounds the second un-doped channel 203 in p-VFET region 204 and extends to the third un-doped channel 205, surrounds the third un-doped channel 205 in the NiP diode region 206 and extends to the fourth un-doped channel 207 and surrounds the fourth un-doped channel 207 in the PiN diode region 208.

Figure 4:
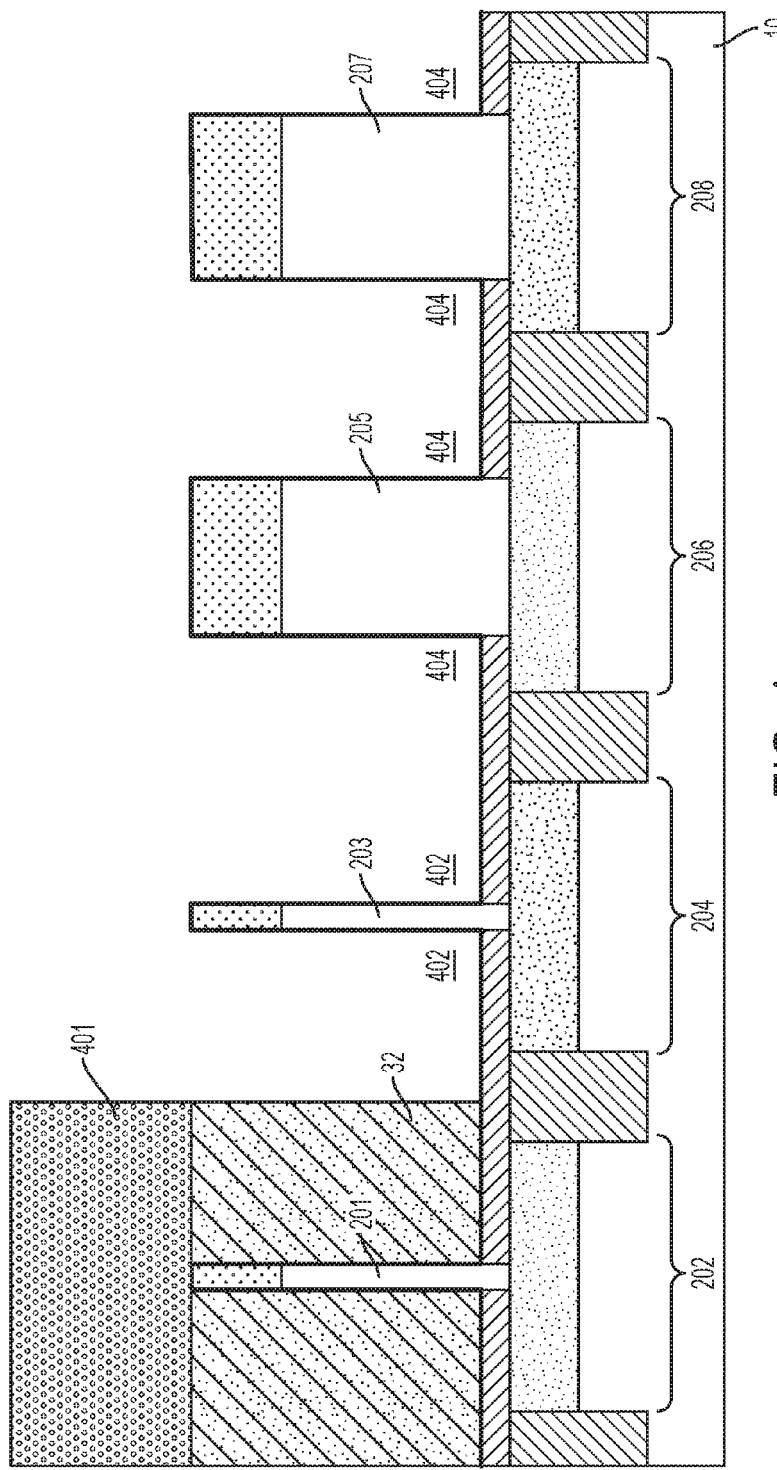

With reference to FIG. 4, the portion of the n-type metal gate material 32 that surrounds the first un-doped channel 201 in the n-VFET region 202 is masked by mask 401. The mask 401 can include any nitride or oxide dielectric material. Once the mask 401 is formed, the respective portions of the n-type gate material 32 that surround the second un-doped channel 203 in the p-VFET region 204, the third un-doped channel 205 in the NiP diode region 206 and the fourth un-doped channel 207 and the PiN diode region 208 are removed by any suitable process. Such removal results in the formation of empty regions 402, 403 and 404. Empty region 402 surrounds the second un-doped channel 203 in the p-VFET region 204, empty region 403 surrounds the third un-doped channel 205 in the NiP diode region 206 and empty region 404 surrounds the fourth un-doped channel 207 and the PiN diode region 208.

Figure 5:
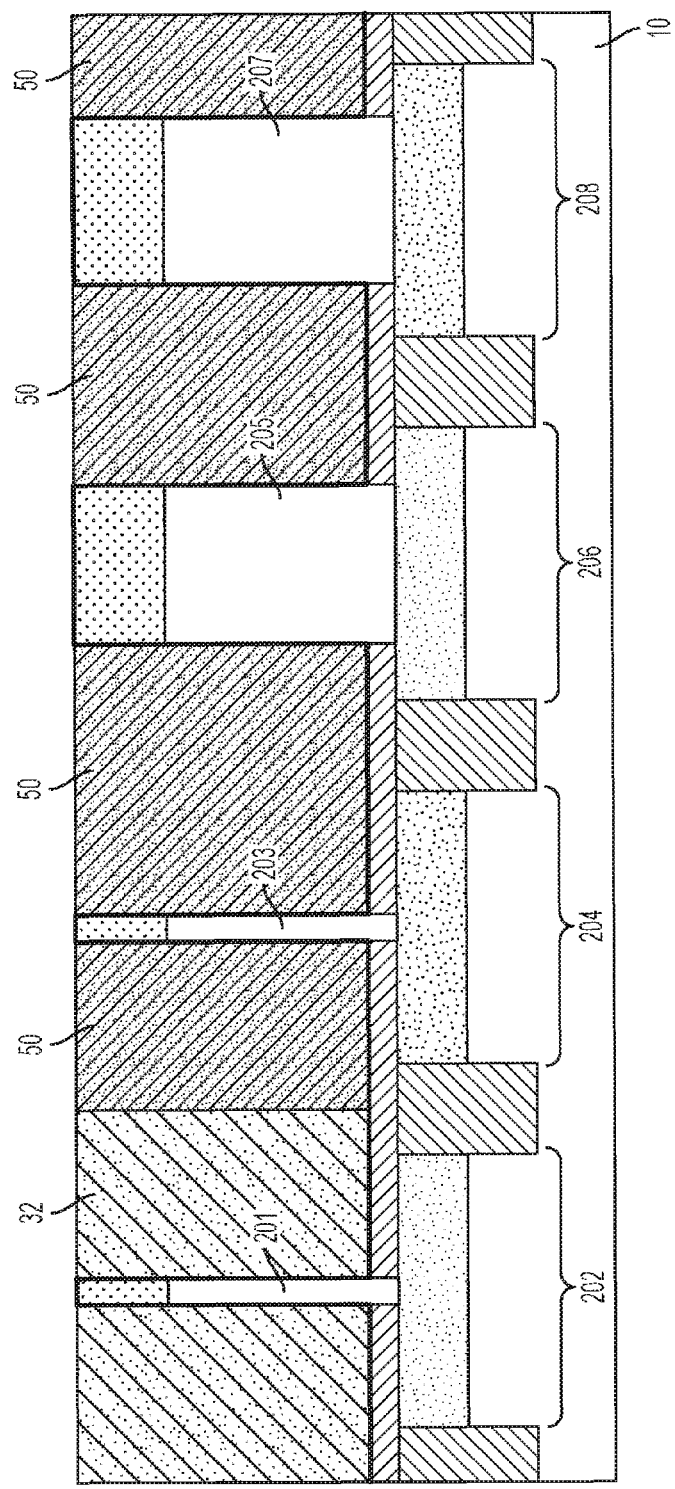

With reference to FIG. 5, p-type metal gate material 50 is deposited in the formerly empty regions 402, 403 and 404 (this would be n-type gate material if the n-type gate material 32 were p-type gate material instead). Thus, as shown in FIG. 5, the p-type metal gate material 50 effectively surrounds the second un-doped channel 203 in p-VFET region 204 and extends to the third un-doped channel 205, surrounds the third un-doped channel 205 in the NiP diode region 206 and extends to the fourth un-doped channel 207 and surrounds the fourth un-doped channel 207 in the PiN diode region 208.

Figure 6:
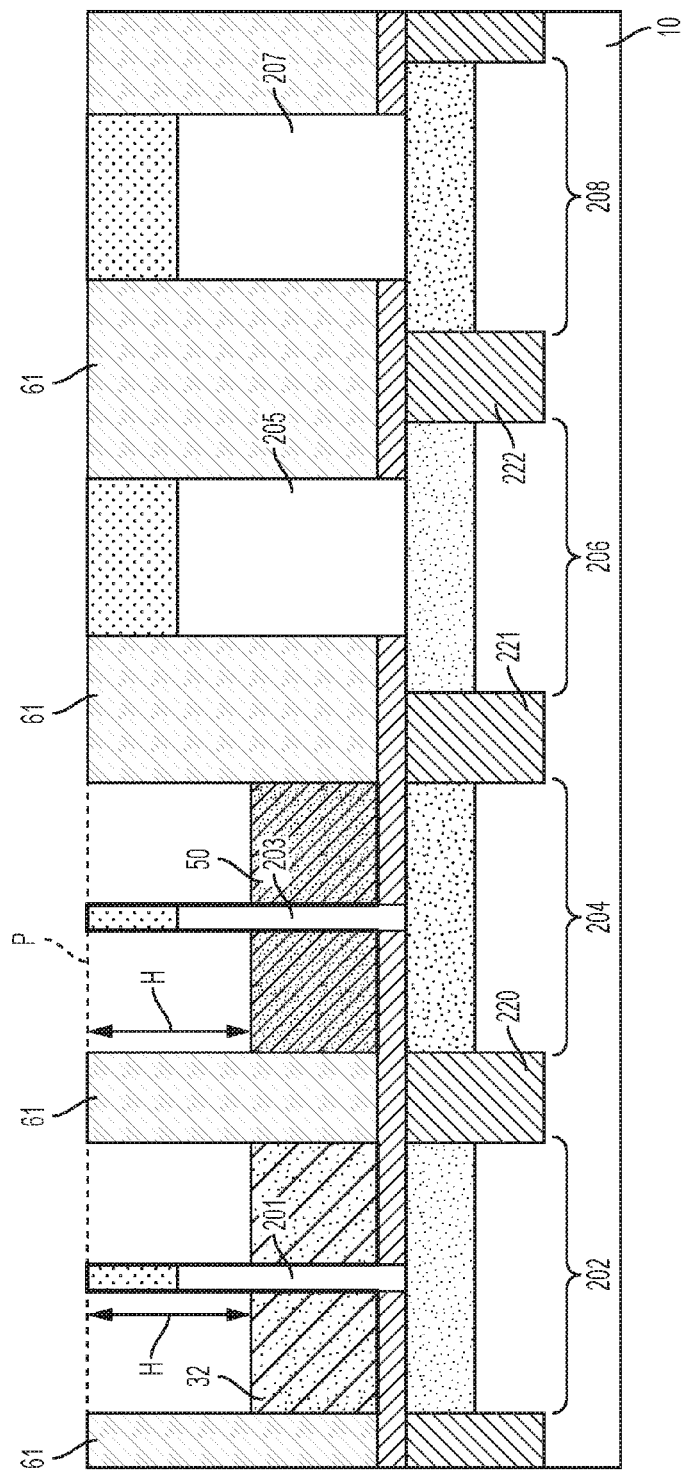

With reference to FIG. 6, the n-type gate material 32 that still surrounds the first un-doped channel 201 in the n-VFET region 202 is patterned to extend radially outwardly only to the extent of the area of the n-VFET region 202. Similarly, the p-type gate material 50 that surrounds the second un-doped channel 203 in the p-VFET region 204 is patterned to extend radially outwardly only to the extent of the area of the p-VFET region 204. The remainder of the p-type gate material 50 and the high-k dielectric layer 31 in the NiP and PiN diode regions 206 and 208 and above the STI feature 221. This patterning of the n-type and p-type gate materials 32 and 50 and the removal of the remainder of the p-type gate material 50 and the high-k dielectric layer 31 results in the formation of empty regions.

As shown in FIG. 6, interlayer dielectric (ILD) material 61 is deposited in these empty regions to surround the remaining n-type and p-type gate materials 32 and 50 and to surround the third and fourth un-doped channels 205 and 207 in the NiP and PiN diode regions 206 and 208. The ILD material 61 is substantially coplanar with the upper surfaces of the hard masks 210 at plane P following a chemical mechanical polishing (CMP) process, for example, and the n-type and p-type gate materials 32 and 50 are recessed from plane P by a predetermined height H that can be the same or different for each of the n-type and p-type gate materials 32 and 50.

Figure 7:
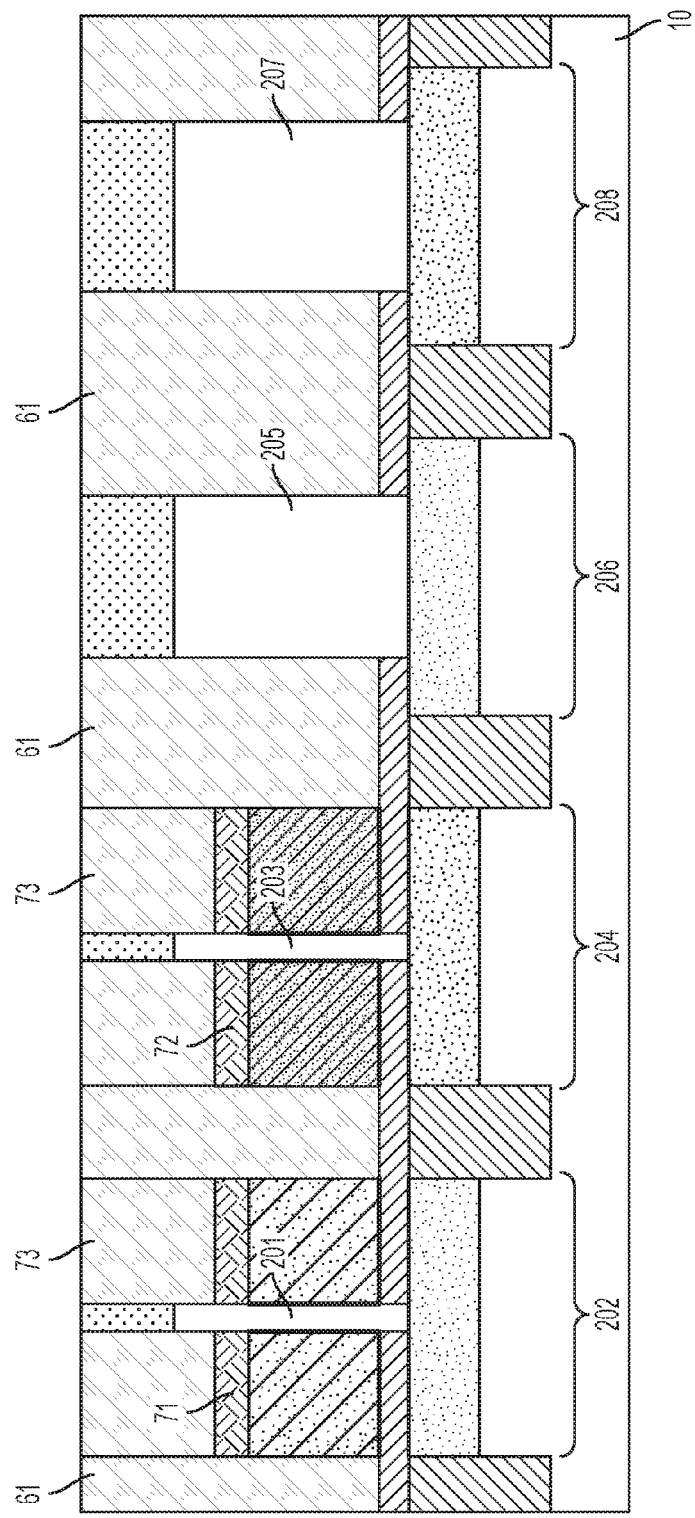

With reference to FIG. 7, a first top spacer 71 is formed over the n-type gate material 32 and a second top spacer 72 is formed over the p-type gate material 50. The first and second top spacers 71 and 72 can be formed by directional deposition or another suitable process and can include any nitride or oxide material. Once the first and second top spacers 71 and 72 are formed, a second ILD material 73 is deposited over the first and second top spacers 71 and 72. The second ILD material 73 can be similar to or different from the ILD material 61 and is coplanar with the plane P following a CMP process or another similar processing technique.

Figure 8:
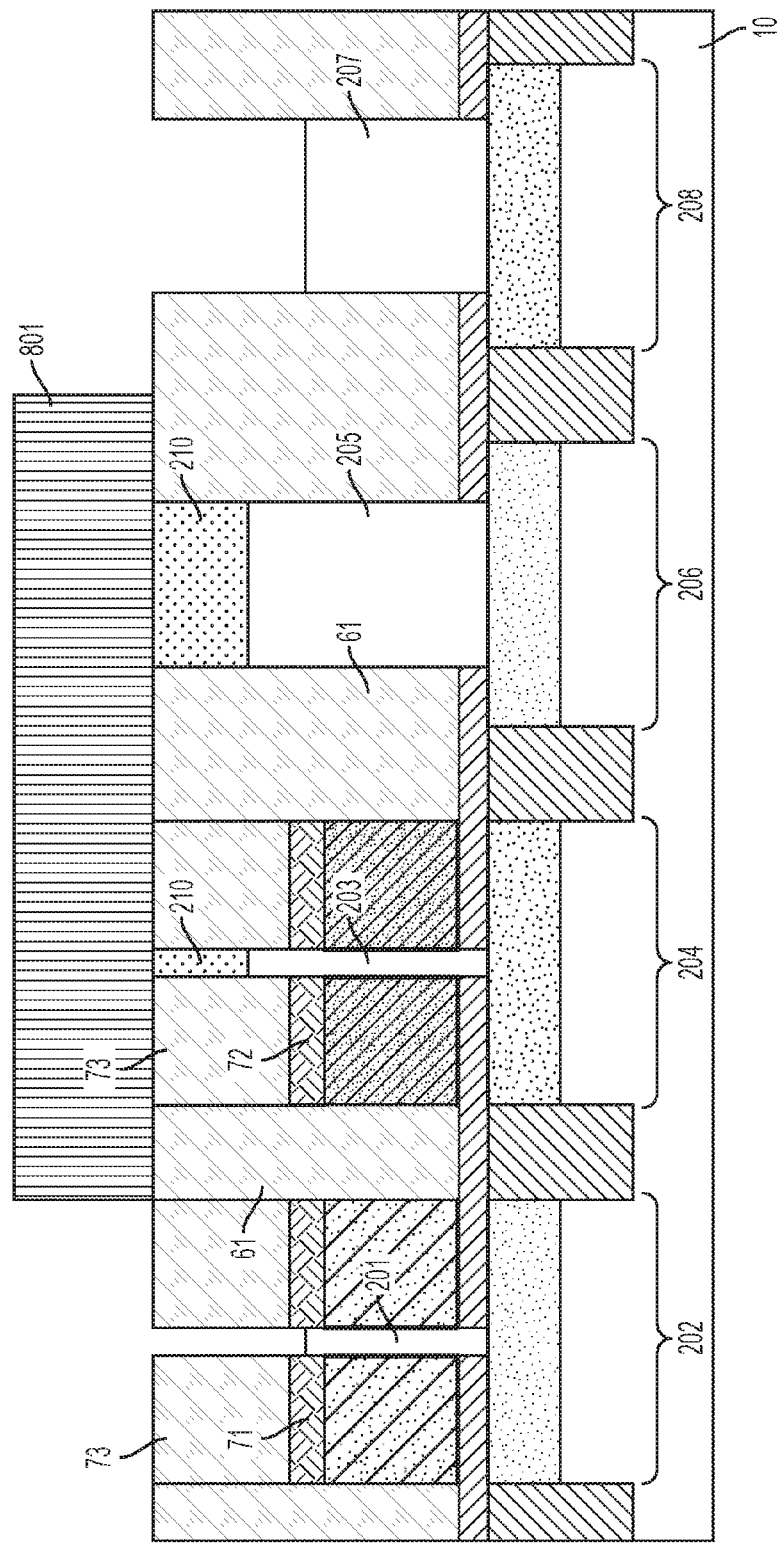

With reference to FIG. 8, a mask 801 is formed by deposition or other similar processes over the ILD material 61 and the second ILD material 73 as well as the hard masks 210 of the second un-doped channel 203 and the third un-doped channel 205 at the p-VFET region 204, the NiP diode region 206, the STI feature 221 and at least respective portions of STI features 220 and 222. The mask 801 can be formed of any suitable nitride or oxide dielectric material. Once the mask 801 is formed, the hard masks 210 of the first un-doped channel 201 and the fourth un-doped channel 207 are removed by suitable processes. Subsequently, respective upper portions of the first un-doped channel 201 and the fourth un-doped channel 207 are recessed. As a result, the uppermost surface of the first un-doped channel 201 is coplanar with a layer of the first top spacer 71 and the uppermost surface of the fourth un-doped channel 207 is lower than the uppermost surface of the third un-doped channel 205.

Figure 9:
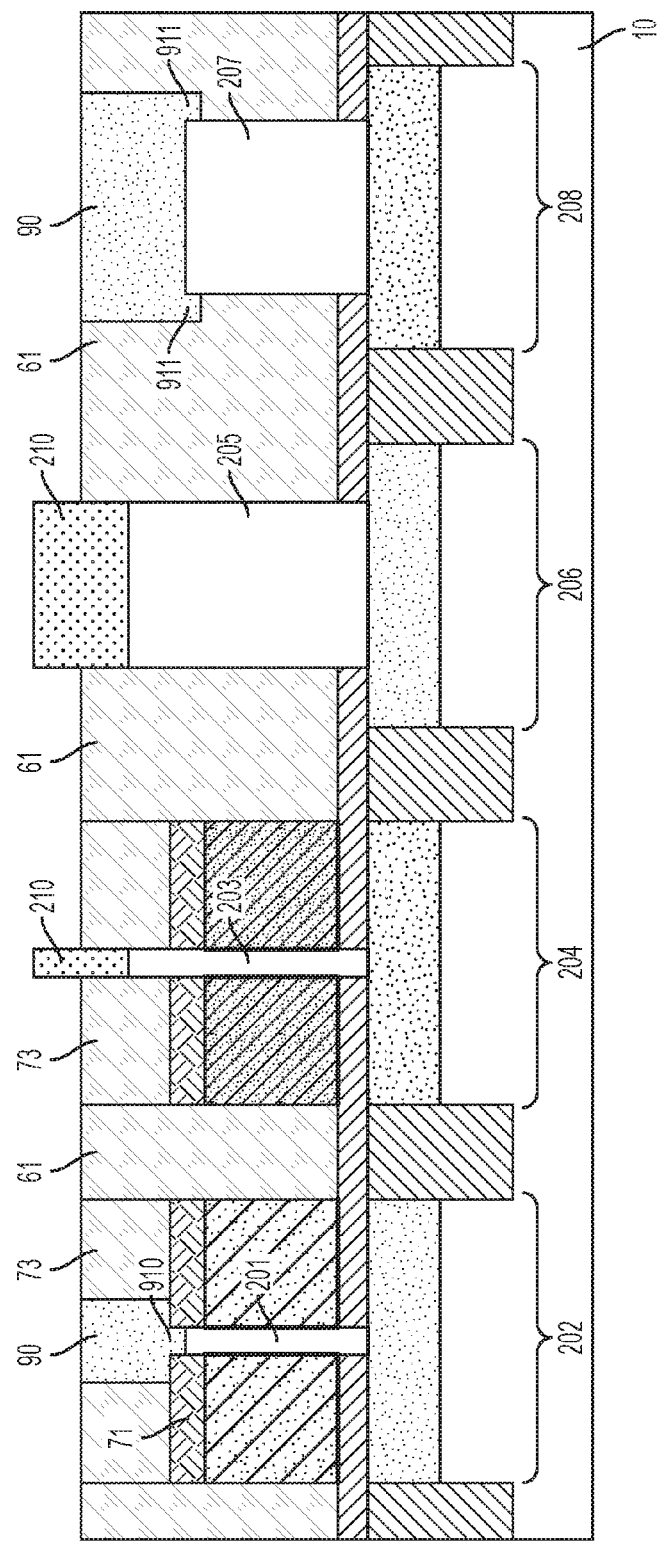

With reference to FIG. 9, an epitaxy pre-cleaning process is conducted and can involve some degree of etching of the ILD material 61 and the second ILD material 73. This etching results in respective uppermost surfaces of the ILD material 61 and the second ILD material 73 being recessed from the respective uppermost surfaces of the remaining hard masks 210. Next, as shown in FIG. 9, a set of first common n-type epitaxial contacts 90 are grown substantially simultaneously by n-type in-situ doped epitaxial growth processes (e.g., in-situ phosphorus doped silicon epitaxy). These common n-type epitaxial contacts 90 are thus disposed to be contact with the first un-doped channel 201 in the n-VFET region 202 and the fourth un-doped channel 207 in the PiN diode region 208. In accordance with one or more embodiments, the first common n-type epitaxial contact 90 that is disposed in contact with the first un-doped channel 201 is provided as n-VFET top source and drain contacts and can sit on a proximal portion of the top spacer 71 with contact-channel contact actually made by a pillar element 910. The first common n-type epitaxial contact 90 that is disposed in contact with the fourth un-doped channel 207 is provided as an n-type terminal of a PiN diode and can sit on an uppermost surface thereof with additional contact-channel contact made by flange elements 911.

Figure 10:
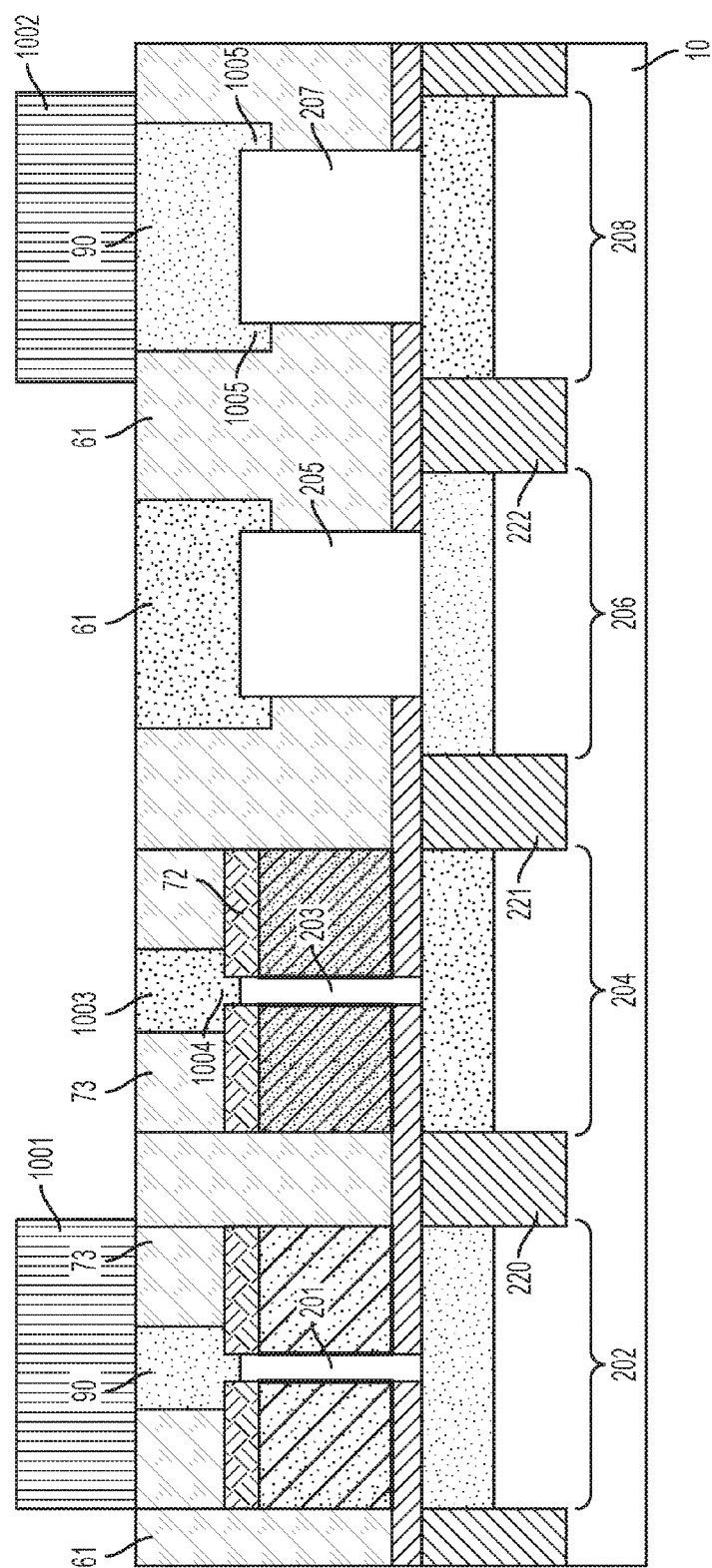

With reference to FIG. 10, masks 1001 and 1002 are formed over the first common n-type epitaxial contacts 90, the ILD material 61 and the second ILD material 73 in the n-VFET region 202, the PiN diode region 208 and above respective portions of the proximal STI features 220 and 222 (as well as the respective proximal portions of any additional STI features). The masks 1001 and 1002 can be formed of any suitable nitride or oxide dielectric material.

Once the masks 1001 and 1002 are formed, as shown in FIG. 10, a set of second common p-type epitaxial contacts 1003 are grown substantially simultaneously by p-type in-situ doped epitaxial growth processes (e.g., in-situ boron doped silicon or silicon germanium). These common p-type epitaxial contacts 1003 are thus disposed to be contact with the second un-doped channel 203 in the p-VFET region 204 and the third un-doped channel 205 in the NiP diode region 206. In accordance with one or more embodiments, the second common p-type epitaxial contact 1003 that is disposed in contact with the second un-doped channel 203 is provided as p-VFET top source and drain contacts and can sit on a proximal portion of the top spacer 72 with contact-channel contact actually made by a pillar element 1004. The second common p-type epitaxial contact 1003 that is disposed in contact with the third un-doped channel 205 is provided as a p-type terminal of an NiP diode and can sit on an uppermost surface thereof with additional contact-channel contact made by flange elements 1005.

Once again, it is to be understood that the processes illustrated in FIGS. 8-10 can be reversed such that the set of second common p-type epitaxial contacts 1003 are formed first and the set of first common n-type epitaxial contacts 90 are formed second.

Figure 11:
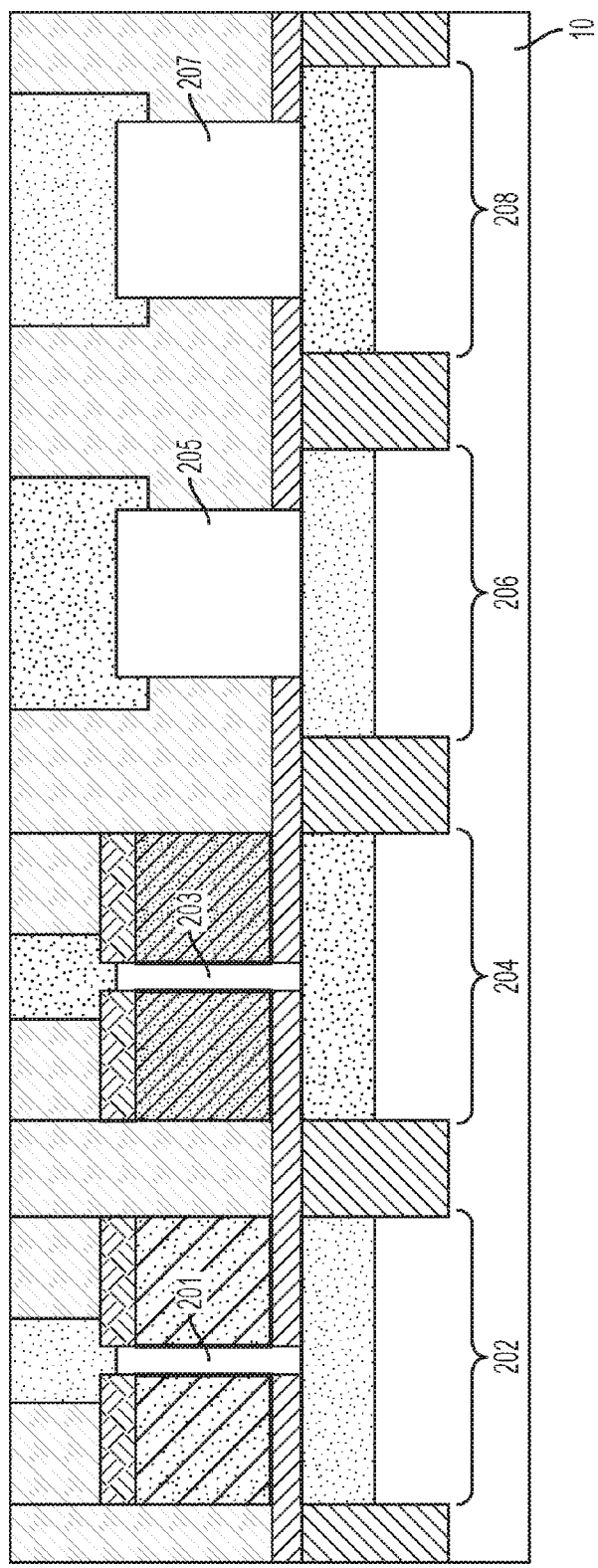

With reference to FIG. 11, formation of the integrated device mentioned above is completed with the removal of the masks 1001 and 1002.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated device comprising:
    a substrate comprising an upper surface with first substrate regions doped with a first dopant and second substrate regions doped with a second dopant;
    a first vertical transistor operably disposed on the upper surface at a first one of the first substrate regions;
    a second vertical transistor operably disposed on the upper surface at a first one of the second substrate regions;
    a first diode operably disposed on the upper surface at a second one of the first substrate regions;
    a second diode operably disposed on the upper surface at a second one of the second substrate regions; and
    first and second common epitaxy for the first vertical transistor and the second diode and for the second vertical transistor and the first diode, respectively.

2. The integrated device according to claim 1, wherein the first and second vertical transistors are isolated by trench isolation.

3. The integrated device according to claim 1, wherein the first and second substrate regions are interleaved.

4. The integrated device according to claim 1, wherein the first dopant comprises an n-type dopant and the second dopant comprises a p-type dopant.

5. The integrated device according to claim 1, wherein fins for each of the first and second diodes are wider than fins for the first and second vertical transistors.

6. The integrated device according to claim 1, further comprising interlayer dielectric (ILD) disposed around and over the first and second vertical transistors and the first and second diodes.

7. A method of forming an integrated device, the method comprising:
    defining, in an upper surface of a substrate, first substrate regions doped with a first dopant and second substrate regions doped with a second dopant;
    operably disposing a first vertical transistor on the upper surface at a first one of the first substrate regions, a second vertical transistor on the upper surface at a first one of the second substrate regions, a first diode on the upper surface at a second one of the first substrate regions and a second diode on the upper surface at a second one of the second substrate regions; and
    growing first common epitaxy for the first vertical transistor and the second diode and second common epitaxy for the second vertical transistor and the first diode.

8. The method according to claim 7, further comprising separating the first and second vertical transistors by trench isolation.

9. The method according to claim 7, further comprising interleaving the first and second substrate regions.

10. The method according to claim 7, wherein the first dopant comprises an n-type dopant and the second dopant comprises a p-type dopant.

11. The method according to claim 7, wherein fins for each of the first and second diodes are wider than fins for the first and second vertical transistors.

12. The method according to claim 7, further comprising depositing interlayer dielectric (ILD) around and over the first and second vertical transistors and the first and second diodes.

13. The method according to claim 7, wherein the first and second vertical transistors are operably disposed before the first and second diodes.

14. The method according to claim 7, wherein:
    the first common epitaxy is grown simultaneously for the first vertical transistor and the second diode, and
    the second common epitaxy is grown simultaneously for the second vertical transistor and the first diode.

15. The method according to claim 7, wherein one of the first and second common epitaxy is grown before the other of the first and second common epitaxy is grown.

16. A method of forming an integrated device, the method comprising:
    forming fin and pillar structures in insulated vertical transistor and diode regions, respectively, of a doped upper surface of a semiconductor substrate;
    sequentially modifying the fin structures into n-type and p-type vertical field effect transistors (VFETs) and the pillar structures into PiN and NiP diodes; and
    growing first common epitaxial contacts for the n-type VFETs and the NiP diodes and second common epitaxial contacts for the p-type VFETs and the PiN diodes.

17. The method according to claim 16, wherein the sequential modifying comprises:
    completing modifications of one of the n-type or the p-type VFETs;
    completing modifications of the other of the n-type or the p-type VFETs;
    completing modifications of one of the PiN diodes or the NiP diodes; and
    completing modifications of the other of the PiN diodes or the NiP diodes.

18. The method according to claim 17, wherein the completing of the modifications of the n-type and the p-type VFETs comprises:
    forming bottom spacers;
    depositing high-k dielectric material;
    patterning and recessing n-type and p-type gate metals; and
    forming top spacers.

19. The method according to claim 17, wherein the completing of the modifications of the PiN and NiP diodes comprises:
    epitaxy pre-cleaning; and in-situ n-type and p-type doped epitaxial growing of n-type and p-type diode terminals.

20. The method according to claim 16, wherein:

the growing of the first common epitaxial contacts comprises masking the p-type VFETs and the PiN diodes, and the growing of the second common epitaxial contacts comprises masking the n-type VFETs and the NiP diodes.

* * * * *